United States Patent
Kettinger et al.

(10) Patent No.: US 11,402,454 B2
(45) Date of Patent: Aug. 2, 2022

(54) CORRECTION OF DISTORTED DIFFUSION-WEIGHTED MAGNETIC RESONANCE IMAGE DATA

(71) Applicant: Siemens Healthcare GmbH, Erlangen (DE)

(72) Inventors: Adam Kettinger, Bayern (DE); Josef Pfeuffer, Kunreuth (DE); Manuel Stich, Parkstein (DE); Thorsten Feiweier, Poxdorf (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/155,380

(22) Filed: Jan. 22, 2021

(65) Prior Publication Data

US 2021/0231763 A1 Jul. 29, 2021

(30) Foreign Application Priority Data

Jan. 23, 2020 (DE) .......................... 102020200786.1

(51) Int. Cl.
*G01V 3/00* (2006.01)
*G01R 33/565* (2006.01)
(Continued)

(52) U.S. Cl.
CPC ..... *G01R 33/56518* (2013.01); *G01R 33/543* (2013.01); *G01R 33/5608* (2013.01); *G01R 33/56341* (2013.01)

(58) Field of Classification Search
CPC .............. G01R 33/543; G01R 33/5659; G01R 33/3415; G01R 33/36; A61B 5/055
USPC ......................................................... 324/309
See application file for complete search history.

(56) References Cited

U.S. PATENT DOCUMENTS 6,384,601 B1 * 5/2002 Wiesler .............. G01R 33/4838
324/309
6,636,038 B1 * 10/2003 Heid ...................... G01R 33/54
324/307
(Continued)

FOREIGN PATENT DOCUMENTS

EP 3640661 A1 4/2020

OTHER PUBLICATIONS

Haselgrove et al., "Correction for Distortion of Echo-Planar Images Used to Calculate the Apparent Diffusion", Magnetic Resonance in Medicine, vol. 36, pp. 960-964 (1996).
(Continued)

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

The disclosure relates to techniques for reducing eddy current-induced magnetic field interferences for a diffusion imaging pulse sequence. A gradient impulse response function (GIRF) is determined, and an interference gradient sequence ($G_{x/y/z}(t)$) is defined on the basis of the diffusion imaging pulse sequence. A time interval ($t_1$, $t_2$) is determined for the acquisition of diffusion image data. On the basis of the determined gradient impulse response function (GIRF) and the interference gradient sequence ($G_{x/y/z}(t)$), a time-dependent magnetic field deviation ($\Delta B_{x/y/z}(t)$) in the determined time interval ($t_1$, $t_2$) is determined. An image distortion of an acquisition of diffusion imaging is compensated, which takes place by application of the diffusion imaging pulse sequence on the basis of the determined magnetic field deviation ($\Delta B_{x/y/z}(t)$).

17 Claims, 7 Drawing Sheets

(51) Int. Cl.
*G01R 33/54* (2006.01)
*G01R 33/56* (2006.01)
*G01R 33/563* (2006.01)

(56) References Cited

U.S. PATENT DOCUMENTS

| | | | | |
|---|---|---|---|---|
| 2005/0024051 | A1* | 2/2005 | Doddrell | A61B 5/7257 |
| | | | | 324/307 |
| 2010/0171498 | A1 | 7/2010 | Auslender et al. | |
| 2011/0085722 | A1 | 4/2011 | Feiweier | |
| 2011/0187367 | A1 | 8/2011 | Feiweier et al. | |
| 2011/0241679 | A1* | 10/2011 | Feiweier | G01R 33/56341 |
| | | | | 324/309 |
| 2011/0260727 | A1* | 10/2011 | Punchard | G01R 33/3875 |
| | | | | 324/318 |
| 2013/0033262 | A1* | 2/2013 | Porter | G01R 33/56341 |
| | | | | 324/309 |
| 2014/0125333 | A1* | 5/2014 | Hanada | G01R 33/56518 |
| | | | | 324/307 |
| 2015/0293202 | A1 | 10/2015 | Feiweier | |
| 2018/0120397 | A1* | 5/2018 | Kluge | G01R 33/56518 |
| 2018/0335488 | A1 | 11/2018 | Feiweier | |
| 2020/0116807 | A1 | 4/2020 | Holscher et al. | |

OTHER PUBLICATIONS

Vannesjo, Johanna S et al. "Field Camera Measurements of Gradient and Shim Impulse Responses Using Frequency Sweeps" Magnetic Resonance in Medicine, vol. 72, pp. 570-583, (2014).

Campbell-Washburn Adrienne E.; "Real-time distortion correction of spiral and echo planar images using the gradient system impulse response function"; Magnetic Resonance in Medicine; vol. 75; No. 6; pp. 2278-2285; (2016) XP055708313; ISSN: 0740-3194; DOI: 10.1002/mrm.25788; US; (2015).

M. Stich et al. "Gradient waveform pre-emphasis based on the gradient system transfer function", Magnetic Resonance in Medicine, vol. 80, pp. 1521-1532, DOI: 10.1002/mrm.27147; (2018).

Bodammer et al., "Eddy Current Correction in Diffusion-Weighted Imaging Using Pairs of Images Acquired With Opposite Diffusion Gradient Polarity", Magnetic Resonance in Medicine, vol. 51, pp. 188-193 (2004).

Rahmer, Jürgen et al. "Rapid acquisition of the 3D MRI gradient impulse response function using a simple phantom measurement", Magnetic Resonance in Medicine/vol. 82; DOI: 10.1002/mrm. 27902; (2019).

Vannesjo, Signe J. et al. "Gradient System Characterization by Impulse Response Measurements with a Dynamic Field Camera" Magnetic Resonance in Medicine, vol. 69, pp. 583-593, (2013).

Vannesjo, Johanna S. et al.; "Image Reconstruction Using a Gradient Impulse Response Model for Trajectory Prediction"; Magnetic Resonance in Medicine; vol. 76; pp. 45-58; (2016).

Robison, Ryan K. et. al., "Correction of B0 eddy current effects in spiral MRI.", in: Magn Reson Med., vol. 81, pp. 2501-2513, (2019).

O'Brien et al; "3-D Residual Eddy Current Field Characterisation: Applied to Diffusion Weighted Magnetic Resonance Imaging"; IEEE Trans. Med. Imag.; vol. 32; p. 1515; 2013; (2013).

Stich, M. et. al., "Temperature-dependent gradient system response." Magnetic Resonance in Medicine, vol. 00, pp. 1-9, (2019).

German action dated Nov. 12, 2020, Application No. 10 2020 200 786.1.

* cited by examiner

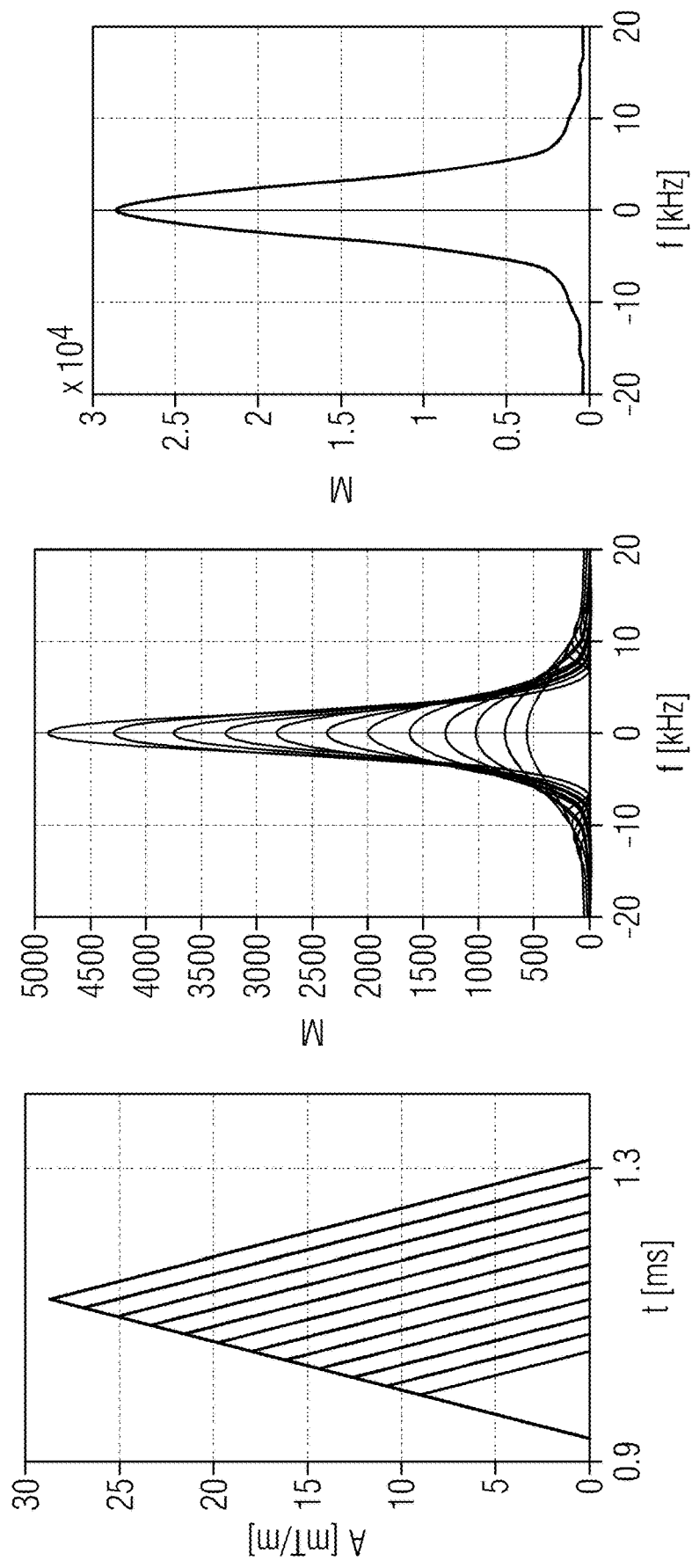

CORRECTION OF DISTORTED DIFFUSION-WEIGHTED MAGNETIC RESONANCE IMAGE DATA

CROSS-REFERENCE TO RELATED APPLICATIONS

The present application claims the benefit of the filing date of German patent application no. DE 10 2020 200 786.1, filed on Jan. 23, 2020, the contents of which are incorporated herein by reference in their entirety.

TECHNICAL FIELD

The disclosure relates to techniques for the reduction of eddy current-induced magnetic field interferences for a diffusion imaging pulse sequence, techniques for the acquisition of diffusion-weighted magnetic resonance image data of an examination object, an image correction device, and a magnetic resonance system.

BACKGROUND

Diffusion-weighted magnetic resonance acquisitions are magnetic resonance acquisitions with the aid of which the diffusion movement of particular materials, in particular of water molecules, in the body tissue can be measured and depicted in a spatially resolved manner.

Diffusion imaging has established itself in clinical practice, in particular for the diagnosis of strokes, since the affected regions of the brain can already be identified much earlier in diffusion-weighted images than in the conventional magnetic resonance acquisitions. In addition, diffusion imaging is also increasingly being used in the field of oncological, cardiological, and musculoskeletal diseases. One variant of diffusion-weighted magnetic resonance imaging is diffusion tensor imaging, in which the directionality of the diffusion is also detected. Diffusion-weighted magnetic resonance acquisitions hereinafter comprise magnetic resonance acquisitions generated in the course of diffusion-weighted magnetic resonance imaging processes and magnetic resonance acquisitions generated in the course of diffusion tensor imaging processes.

"Magnetic resonance acquisitions" are hereinafter taken to mean image data generated with the aid of a magnetic resonance device actuated in the course of an imaging method, of the inside of an examination object, but also parameter maps, which reproduce a spatial or temporal distribution of particular parameter values inside the examination object and can be generated, for example, from the image data. An "acquisition" of magnetic resonance image data is taken to mean the performance of an image acquisition method with the aid of a magnetic resonance imaging system.

SUMMARY

Diffusion-encoded raw data has to be acquired first for the generation of diffusion-weighted magnetic resonance acquisitions. This occurs with specific measuring sequences, which will be referred to hereinafter as diffusion gradient measuring sequences. Characteristic of these measuring sequences is that, following a customary deflection of the spins into a plane perpendicular to the basic magnetic field of the magnetic resonance tomography system, a particular sequence of gradient magnetic field pulses is switched, which varies the field strength of the outer magnetic field in a specified direction. Where a diffusion movement exists, the precessing nuclei come out of phase, and this becomes noticeable in the measurement signal.

With diffusion imaging, as a rule, a plurality of images with different directions of diffusion and weightings, in other words, with different diffusion-encoding gradient impulses, are acquired and combined with each other. The strength of the diffusion weighting is usually defined by what is known as a diffusion weighting factor, also referred to as the "b-value". The different diffusion images or the images combined therefrom or parameter maps can then be used for the desired diagnostic purposes. To be able to correctly estimate the effect of the diffusion movement, in many cases a further reference record is used for comparison, in which no diffusion-encoding gradient impulse is switched, in other words, an image where b=0. The pulse measuring sequence for the acquisition of the reference raw data is constructed in the same manner as the diffusion gradient measuring sequence with the exception of the emission of the diffusion-encoding gradient impulses. Alternatively, a reference acquisition with a b-value≠0 can also be carried out.

In the case of diffusion-weighted echo planar imaging, abbreviated as dw-EPI, distortions caused by eddy currents occur. The occurrence of the distortions is linked to the high gradient amplitudes of the diffusion gradients used in dw-EPI and the high level of sensitivity of dw-EPI to static and dynamic field interferences. Typical values for the sensitivity of EPI sequences are 10 Hz/pixel in the phase-encoding direction.

As already mentioned, conventionally a plurality of images is acquired with different directions of diffusion and weightings and combined with each other in diffusion imaging to calculate, for example, parameter maps therefrom. The created parameter maps are then used for diagnostic purposes. The diffusion gradients generated during imaging cause eddy current fields, however, which in turn contribute to image distortions whose shape depends on the amplitude of the gradients and the direction thereof. If the individual images acquired are combined with each other in an uncorrected manner, erroneous allocations of pixel information thus occur owing to the distortions that are different for each image. This results in errors or at least in a reduced precession of the calculated parameters.

Conventionally, registering methods are used for the reduction of eddy current-induced dw-EPI distortions. In such methods, a reference image is defined. The reference image is, as a rule, an image without diffusion weighting or an appropriate anatomical image. Optimization methods are then applied to the distorted images using defined transformation rules, such as, for example, scaling, shearing, displacement or also more complex transformations of higher orders in order to align the distorted image to the geometry of the reference image. Approaches of this kind are described in Haselgrove et al. in Magn. Reson. Med. 26:960, 1996; and Bodammer et al., Magn. Reson. Med. 51:188, 2004.

However, there are issues with registering methods with respect to the quality of the images and the movement of the examination object. In particular, with diffusion imaging of the trunk, for example the abdomen, the signal-to-noise ratio of individual images with higher diffusion weightings can be so low that reliable registering of the images is no longer possible. A movement of the examination object can lead to the defined transformation properties underlying the registering methods no longer being applicable.

In an alternative approach by O'Brien et al., IEEE Trans. Med, Imag. 32:1515, 2013, the eddy current behavior of an MR system is firstly characterized in the course of the system setup and this information subsequently used in the actual diffusion measurement for the correction of the images. However, with this procedure the recording length is very long, the actual measuring procedure can be taken into account to only a limited extent, and it is necessary that the course of the calibration measurement over time has to be appropriate for the subsequent clinical measurement. This limitation results in a separate appropriate calibration having to be performed for each clinical measuring protocol.

It is the object of the present disclosure to develop a robust, fast, and precise method for the correction of distortions in diffusion-weighted imaging. This object is achieved by a method for the reduction of eddy current-induced magnetic field interferences for a diffusion imaging pulse sequence as described throughout the disclosure with respect to the various embodiments and further in the claims.

In the course of the method embodiments for the reduction of eddy current-induced magnetic field interferences for a diffusion imaging pulse sequence, a gradient impulse response function is determined. This gradient impulse response function is generically determined with the aid of a test gradient sequence for an MR system. In other words, it is subsequently universally applicable to different pulse sequences. The measurement data for the gradient impulse response function is determined with an MR experiment in which RF excitation pulses are generated and MR signals are detected. The MR pulse sequence comprises an RF pulse, a slice selection gradient, and the test gradients.

In addition, an interference gradient sequence is defined on the basis of the diffusion imaging pulse sequence. The interference gradient sequence comprises gradients, which contribute to an eddy current-induced magnetic field interference. As a rule, these are the gradients of a pulse sequence with the strongest amplitudes.

If a reference measurement is performed to determine the gradient impulse response function, as will be explained later in more detail, it is crucial that the interference gradient sequence includes those gradients, which characterize a deviation from the reference measurement.

In a simple case, the reference measurement is carried out with a b-value b=0, in other words, without diffusion gradients. The acquisition to be corrected is then performed with a b-value b>0, in other words, with diffusion gradients. Here the interference gradient sequence includes the diffusion gradients of the acquisition to be corrected.

In a more complex case, the reference measurement is carried out with a low b-value and additional spoiler gradients. The acquisition to be corrected then takes place with a high b-value without spoiler gradients. Here, the interference gradient sequence includes the diffusion gradients of the acquisition to be corrected and the diffusion and spoiler gradients of the reference measurement with inverted polarity. Only when the expected distortion due to the gradients of the reference measurement is small, for example smaller by a factor of 10 than that of the strong diffusion gradients, can the contribution thereof be disregarded.

Furthermore, a time interval with the marginal times $t_1$, $t_2$ for the acquisition of diffusion image data is determined because each field deviation that occurs during the acquisition of the diffusion image data leads to image distortions in diffusion imaging. The signal phase additionally accumulated during the acquisition of the raw data owing to the field deviations is added to the correct signal phase owing to the switched spatially-encoding gradient fields, and leads to spatial displacements in the image data space.

In a further step of the image correction method embodiments, a time-dependent magnetic field deviation, also called a field deviation for short hereinafter, is determined in the determined time interval on the basis of the determined gradient impulse response function and the interference gradient sequence.

The field deviations $\Delta B_{x/y/z}(t)$ may be calculated from what are known as corrected gradients $G_{x/y/z}^{corr}(t)$. The corrected gradients result from a convolution of the gradient impulse response function with the nominal gradients $G_{x/y/z}(t)$ of the interference gradient sequence, defined by the pulse sequence, in the spatial domain or a multiplication of the Fourier transform of the gradient impulse response function with the nominal gradient $G_{x/y/z}(t)$ in the frequency domain.

Finally, an image distortion of an acquisition of diffusion imaging, which takes place by application of the diffusion imaging pulse sequence, is compensated on the basis of the determined magnetic field deviation $\Delta B_{x/y/z}(t)$.

Advantageously, an improved image quality and thus a more precise description of the diffusion behavior in an examination region is achieved.

In addition, due to the use of a generic system characterization, in other words, the gradient impulse response function, the image correction method can advantageously be applied for each measuring protocol without the need for renewed calibration measurements.

The compensation can provide for the correction of image distortion, and function as a passive compensation. In this variant, a magnetic field deviation $\Delta B_{x/y/z}$ averaged over the determined time interval is determined on the basis of the time-dependent magnetic field deviation $\Delta B_{x/y/z}(t)$ already determined. A mean field deviation $\Delta B_{x/y/z}$ can be determined, for example as a time integral, over the complete interval of the diffusion image data acquisition provided by Equation 1 below as follows:

$$\Delta B_{x/y/z} = \frac{1}{t_2 - t_1} \int_{t_1}^{t_2} dt \Delta B_{x/y/z}(t). \tag{1}$$

Alternatively, a time interval can also be chosen for the integration in which only the central k-space data is sampled or a weighted averaging with stronger weighting of the central k-space sampling takes place.

A local displacement is determined on the basis of the averaged magnetic field deviation $\Delta B_{x/y/z}$. The functional dependence of the local displacement of signal contributions in the image on the mean field deviation $\Delta B_{x/y/z}$ for a particular diffusion imaging pulse sequence, such as, for example, echo planar imaging, is known in advance.

The local displacement can be determined on the basis of the pixel bandwidth PW along the phase-encoding direction and a frequency deviation $\Delta f$ based on the averaged magnetic field deviation. The pixel bandwidth PW, for example indicated in Hz/pixel or Hz/mm, indicates by which distance an item of information appears displaced in the image if a local frequency deviation $\Delta f$ with a particular value exists. The frequency deviation $\Delta f$ results from the mean field deviation $\Delta B_{x/y/z}$ as provided in Equation 2 bellow as follows:

$$\Delta f = \frac{\gamma}{2\pi} \Delta B_{x/y/z}. \tag{2}$$

The constant γ indicates the gyromagnetic ratio. The pixel bandwidth depends on parameters of the diffusion image data acquisition, such as, for example, the dimensions of the imaging region, the size of the image matrix and the existence of subsampling, such as, for example, with parallel imaging. The pixel bandwidth PW results from the number of image pixels $z_p$, the echo interval $t_E$, and a subsampling factor U in accordance with Equation 3 below as:

$$PW = \frac{U}{z_p \cdot t_E}. \tag{3}$$

Finally, an image correction is performed on the basis of the determined local displacement. The local displacement then results from the quotient Δf/PW comprising frequency deviation Δf and pixel bandwidth PW.

In other words, the known, potentially location-dependent displacement values are used, where a displacement exists, to displace the pixels in accordance with the displacement value or displacement vector to the correct position. With the aid of the image correction embodiments as discussed herein, eddy current-induced image distortions in diffusion imaging are corrected with the aid of a calibration.

There is also the possibility that particular portions of the magnetic field deviations are compensated as early as during the MR acquisition and are not firstly corrected using an MR acquisition that has already taken place. One or more compensation gradient(s) are determined on the basis of the determined magnetic field deviation in this case. A compensation gradient is then switched during diffusion imaging, which takes place by application of the diffusion imaging pulse sequence.

In an embodiment of the active compensation, portions of the magnetic field deviations of a lower order, for example of the zeroth order and first order, are suppressed by switching compensation gradients during diffusion imaging, so these portions no longer cause image distortions.

In the above-mentioned case, those portions of the magnetic field deviations are determined, which may be depicted inside the slice to be acquired as a field contribution of the zeroth order, in other words, a constant offset, and first order, in other words, gradient-like field contributions. Constant or time-variable compensation gradients, parallel to the imaging gradients, are then switched during data acquisition. Contributions of the zeroth order may be compensated by a switchable Bo coil, where present, or by a corresponding displacement of the demodulation frequency for the MR signals.

The field deviations of higher orders which are not "actively" compensated can then, as described above, be taken into account in an image correction that follows acquisition.

If the MR scanner is fitted with fast-switching field coils of a higher order, then in addition to the specifically-mentioned field contributions of the zeroth order and first order, further field contributions of a higher order can also be compensated as early as during the MR acquisition.

It shall be expressly mentioned once again that active compensation by way of switching compensation gradients during the actual diffusion imaging and passive compensation by way of a subsequent image correction can be combined with one other. In this way, the embodiments may be adapted to the technical possibilities of the available hardware of the MR system used for diffusion imaging and other restrictions, for example time restrictions or specifications for the precision of the image depiction.

In the embodiments for the acquisition of diffusion-weighted magnetic resonance image data of an examination object, diffusion-encoded raw data is acquired by means of a diffusion-encoding gradient impulse sequence. Furthermore, diffusion-encoded image data is reconstructed on the basis of the acquired raw data. The reconstructed diffusion-encoded image data is finally subjected to a correction by application of the embodiments discussed herein for the reduction of eddy current-induced magnetic field interferences for a diffusion imaging pulse sequence. The embodiments for the acquisition of diffusion-weighted magnetic resonance image data of an examination object shares the advantages of the embodiments for the reduction of eddy current-induced magnetic field interferences for a diffusion imaging pulse sequence.

The embodiments of an image correction device has an input interface for receiving diffusion imaging data from an examination region. Part of the image correction device is a determination unit for the determination of a gradient impulse response function. The image correction device also comprises a gradient defining unit for defining an interference gradient sequence on the basis of the diffusion imaging pulse sequence. Furthermore, the image correction device also has an interval determination unit for the determination of a time interval for the acquisition of diffusion image data. Part of the image correction device is also an interference field determination unit for the determination of a time-dependent magnetic field deviation on the basis of the determined gradient impulse response function and the interference gradient sequence.

Part of the image correction device is also a compensation unit for the compensation of an image distortion of an acquisition of diffusion imaging, which takes place by application of the diffusion imaging pulse sequence on the basis of the determined magnetic field deviation.

The image correction device embodiments share the advantages of the image correction method embodiments as discussed herein.

The magnetic resonance system embodiments, in addition to a basic field magnet system with which, conventionally in the patient measuring space, a basic field magnetic field is applied, have a control device for the actuation of the basic field magnet system, a transmit antenna system with a radio frequency transmitting device, a gradient system comprising a plurality of gradient coils, with a gradient system interface, a receive antenna system with a radio frequency receiving device, and the image correction device as discussed herein. The magnetic resonance system embodiments share the advantages of the image correction device embodiments as discussed herein.

The image correction device can be implemented in the form of software on a suitable programmable control device of a magnetic resonance system with appropriate storage possibilities. The radio frequency transmitting device, the gradient system interface, and the radio frequency receiving device can also be implemented at least partially in the form of software units, wherein, in turn, other units of these components are pure hardware units, for example a radio frequency amplifier, the radio frequency transmitting device, a gradient pulse generation device of the gradient system interface or an analog-to-digital converter of the radio frequency receiving device, etc. An implementation largely in the form of software, in particular of said units, has the advantage that even previously used magnetic resonance system control devices can be retrofitted by way of a software update to work in accordance with the embodiments as described herein. In this respect, the object is also achieved by a computer program product (e.g. a non-transitory computer-readable medium), which is stored in a portable memory and/or is provided over a network for transmission and can thus be loaded directly into a memory of a programmable magnetic resonance system control device, with program segments and/or executable instructions to carry out all steps of the image correction embodiments and/or all steps of the embodiments for the acquisition of diffusion-weighted magnetic resonance image data of an examination object when the program is run in the control device.

A computer program product of this kind can comprise, in addition to the computer program, optionally additional elements such as, for example, documentation and/or additional components, also hardware components, such as, for example, hardware keys (dongles, etc.) to use the software.

For transport to the control device and/or for storage on or in the control device, a computer-readable medium, for example a memory stick, a hard disk or a different transportable or permanently installed data carrier are used on which the program segments and/or executable instructions of the computer program, which can be read and run by a computing unit of the control device, are stored. The computing unit can have for this, for example, one or more cooperating microprocessor(s), processing circuitry, or the like, which may execute the program segments and/or executable instructions of the computer program to implement the embodiments as discussed herein.

The claims and the following description each contain advantageous embodiments and developments of the disclosure. For instance, the claims of one category can also be developed analogously to the claims of a different category. In addition, in the framework of the disclosure, the different features of different exemplary embodiments and claims can be combined to form new exemplary embodiments.

In an embodiment for the reduction of eddy current-induced magnetic field interferences for a diffusion imaging pulse sequence, different test gradients are played out (e.g. executed or ran) for the determination of the gradient impulse response function. A magnitude response and a phase response to the different test gradients are then measured. In addition, a reference measurement is measured without test gradients. A gradient impulse response function is determined on the basis of the magnitude response and the phase response and the reference measurement. Advantageously, interference effects, which are based, for example, on eddy currents, are also taken into account when determining the gradient impulse response function.

In an embodiment of the image correction, the test gradients have a triangular shape and cover a plurality of frequencies. Advantageously, a broad spectrum of the response behavior of the entire system is detected, so a broad region of the k-space is captured and an exact correction of distortions due to interference fields is enabled. In addition, due to the broad frequency coverage, the determined gradient impulse response function can be universally applied to a wide variety of gradient coil sequences.

Chirp pulses or a combination of triangular and chirp pulses can be used instead of the triangular pulses, however, for determination of the gradient impulse response function. A procedure of this kind is described in Rahmer, J, Mazurkewitz, P, Bornert, P, Nielsen, T. Rapid acquisition of the 3D MRI gradient impulse response function using a simple phantom measurement. Magn Reson Med. 2019; 82: 2146-2159 and Vannesjo, S. J., Dietrich, B. E., Pavan, M., Brunner, D. O., Wilm, B. J., Barmet, C. and Pruessmann, K. P. (2014), Field camera measurements of gradient and shim impulse responses using frequency sweeps. Magn. Reson. Med., 72: 570-583.

A determination of the pulse response function in the frequency domain is also possible. The convolution operations necessary for the correction are advantageously simplified in the frequency domain.

The described image correction can be applied not only to conventional gradient systems with three orthogonal axes and linear field characteristic but also to MR systems with what are known as gradient arrays with additional channels and with field geometries that differ from conventional gradient systems.

In a variant of the embodiment for the reduction of eddy current-induced magnetic field interferences for a diffusion imaging pulse sequence, the interference gradient sequence comprises the diffusion gradients. Owing to their strength, the diffusion gradients usually have the greatest portion of distortions being caused owing to eddy currents and are particularly advantageously also taken into account in the correction of these distortions.

In an advantageous variant of the embodiment for the reduction of eddy current-induced magnetic field interferences for a diffusion imaging pulse sequence, the interference gradient sequence comprises additional gradients used for diffusion imaging.

The additional gradients used for diffusion imaging can comprise, for example, spoiler gradients. Spoiler gradients contribute to the suppression of undesirable signal coherences. The additional gradients also contribute, even if usually to a lesser extent than the diffusion gradients, to the generation of distortions, so they are advantageously taken into account in the image correction to make the image correction even more precise.

The interference gradient sequence can also comprise all gradients of a pulse sequence, however, in other words, inter alia also the weaker gradients of an imaging sequence necessary for imaging. MR image acquisitions may thus also be corrected without diffusion weighting. Distortions owing to dynamic field interferences, which are generated on the basis of imaging gradients, are reduced in this case.

In a variant of the embodiment for the reduction of eddy current-induced magnetic field interferences for a diffusion imaging pulse sequence, the interference gradient sequence comprises a plurality of diffusion gradient sequences associated with measurements performed in succession. This procedure is expedient, for example, if a rapid sequence of measurements over time occurs, for example of a plurality of slices with a first diffusion weighting and a first diffusion direction, and thereafter with a second diffusion weighting and a second diffusion direction. In this case, transient field interferences occur if the time constants of the eddy current fields lie in the region of the length of an acquisition. In this case, extent and geometry of a distortion of a measurement depend not just on the gradients switched during the measurement, but also on gradients of the preceding measurements. If a plurality of such measurements is carried out in succession, therefore, the history of the preceding switched gradients should thus also be taken into account when determining the gradient impulse response function. The length of the period to be taken into account in this case can be estimated from the determined system characteristics.

The duration of the interference gradient sequence may comprise about three times a time constant that is characteristic of eddy current fields. With three times the length, the interference effects are reduced to $e^{-3}$ times, in other words, to less than 5%. Advantageously, a sufficiently extensive period is taken into account therewith, in which the gradients contribute to the occurrence of an eddy current. In this way, the interference effect of eddy currents can be detected even more accurately with a plurality of measurements carried out successively.

In an embodiment of for the reduction of eddy current-induced magnetic field interferences for a diffusion imaging pulse sequence, a time-dependent magnetic field deviation of the first order is determined on the basis of the interference gradient sequence, and a corrected diffusion gradient sequence, which is calculated by a convolution of the linear self-terms of the determined gradient impulse response function with the interference gradient sequence.

For linear field deviations, the magnetic field deviation then results in accordance with Equation 4 as follows:

$$\Delta B_{x/y/z}^1(t) = (G_{x/y/z}^{corr}(t) - G_{x/y/z}(t)) \cdot (x, y, z). \quad (4)$$

The corrected gradients result in accordance with Equation 5 as follows:

$$G_{x/y/z}^{corr}(t) = \text{GIRF}_{k,k}(t) * G_{x/y/z}(t). \quad (5)$$

The terms $\text{GIRF}_{k,k}(t)$ represent the linear self-terms, whereas x, y, z are the spatial coordinates in the space. K can be x, y or z. The operator "*" causes a convolution in the time domain in accordance with Equation 6 as follows:

$$G_{x/y/z}^{corr} = \int G_{x/y/z}(\tau) \cdot \text{GIRF}_{k,k}(t-\tau) d\tau \quad (6)$$

The linear self-terms describe the frequency-dependent amplitude transfer and phase transfer to the gradient axes X, Y, Z. In other words, cross terms on the axes are not taken into account. The self-terms are time- and temperature-stable. Reference is made in this regard to Stich, M, Pfaff, C, Wech, T, et al. Temperature-dependent gradient system response. Magn Reson Med.2019; 00: 1-9. A multiplication in the frequency domain corresponds to the convolution in the time domain.

In an embodiment for the reduction of eddy current-induced magnetic field interferences for a diffusion imaging pulse sequence, a time-dependent magnetic field deviation of the zeroth order is determined on the basis of a derivation over time of a convolution of the interference gradient sequence with the field terms of the zeroth order of the gradient impulse response function.

The magnetic field deviation of the zeroth order results from a derivation over time of a convolution of the interference gradient sequence with the field terms of the zeroth order of the gradient impulse response function, as follows in accordance with Equation 7 below, in other words:

$$\Delta B_{x/y/z}^0(t) = \frac{1}{\gamma} d(G_{x/y/z}(t) * \text{GIRF}_{0,k}(t))/dt. \quad (7)$$

The terms $\text{GIRF}_{0,k}(t)$ represent the field terms of the zeroth order. The constant $\gamma$ indicates the gyromagnetic ratio. The operator "*" causes a convolution in the time domain.

A detailed description of the application of the gradient impulse response function GIRF for the correction of gradients in the case of Bo field changes can be found in Vannesjo et al., Magn. Reson. Med., 76:45, 2015, Campbell-Wasburn et al., Magn. Reson. Med., 75:2278, 2015, Stich et al., Magn. Reson. Med. 80:1521, 2018 and Robison et al., Magn. Reson. Med. 81:2501, 2018 for numerous non-Cartesian pulse sequences.

Field interferences owing to what are known as cross terms of the first order of the gradient impulse response function can also be taken into account. These indicate the variation over time in the gradient fields on the coordinate axes on which the gradient that triggers the interference is not located. The cross terms describe, for example, the field interferences of an x-gradient on the y-gradient axis. Such an effect is symbolized by a cross term xy. Advantageously, an improved correction of image distortions in diffusion imaging is achieved.

Dynamic B-field interferences of a higher order than the first order can also be taken into account in the image correction. These interference effects can have an impact on the image distortion in the case of MR acquisitions with a relatively large Field of View (FOV) or in the case of displaced measurements in the outer region of the imaging volume. Advantageously, an improved image quality is also achieved in these specific applications.

A short table of the field terms to the third order is illustrated in Table 1 below:

TABLE 1

| No. | Spherical harmonic component | Order |
| --- | --- | --- |
| 0 | 1 | 0 |
| 1 | x | 1 |
| 2 | y | |
| 3 | z | |
| 4 | xy | 2 |
| 5 | zy | |
| 6 | $2z^2 - (x^2 + y^2)$ | |
| 7 | xz | |
| 8 | $x^2-y^2$ | |
| 9 | $3yx^2 - y^3$ | 3 |
| 10 | xyz | |
| 11 | $5yz^2 - y(x^2 + y^2 + z^2)$ | |
| 12 | $2z^3 - 3z(x^2 + y^2)$ | |
| 13 | $5xz^2 - x(x^2 + y^2 + z^2)$ | |
| 14 | $z(x^2 - y^2)$ | |
| 15 | $x^3 - 3xy^2$ | |

If the characteristic over time of B-field interferences of a higher order is identical or at least similar to the characteristic of the interferences of the zeroth or first order, then, advantageously, an often laborious, system-specific determination of these field interferences can be omitted. Instead, the ratio between the interferences of the zeroth or first order and the interferences of a higher order can be defined once only and can then be taken into account in the correction for each gradient axis. For the sake of simplicity, an independent linear superimposition of the field interferences generated by the gradient activity on the different gradient axes is assumed in this case.

The gradient impulse response function can be determined once only on an installation of an MR system and then be stored for subsequent applications. If a change is made to the system, for example a gradient coil is replaced, the characterization can be repeated by way of a determination of the gradient impulse response function. The determined parameters of said characterization can also be determined once on different MR systems of the same type and be stored in any MR system. Advantageously, the effort for the measurement of the characterization of the response behavior of an MR system is greatly reduced.

In an embodiment, a local displacement of image signals or pixels is determined as a scalar displacement transformation field, wherein for every pixel, a displacement of the image information takes place along the phase-encoding direction.

Advantageously, the intensity for each pixel can also be corrected on the basis of the displacement transformation field. In this way, intensity falsifications that occur owing to the distortion correction can be corrected. Advantageously, falsifications of the intensity values of pixels, which result owing to the image correction, are avoided.

Furthermore, the described image correction can also be combined with other image corrections, which work on the basis of the determination of field interferences. The different contributions of the B-field deviations are added and the distortion or the resulting displacement are calculated from the sum of the contributions. In this way, the image quality can be improved further and the image correction of different artifacts can be efficiently performed in one operation.

In an embodiment of the image correction device, the compensation unit has an averaging unit for the determination of a magnetic field deviation averaged over the determined time interval. In addition, the compensation unit has a distortion determination unit for the determination of an image distortion on the basis of the averaged magnetic field deviation. The compensation unit also comprises a correction unit for the performance of an image correction on the basis of the determined image distortion. In this embodiment, a passive compensation of the eddy current-induced distortions is achieved. In this variant, only the evaluation of the image acquisition has to be supplemented in comparison to the conventional procedure, so the effort for the implementation of the image correction device is low.

In a variant of an embodiment of the image correction device, the determination unit has a test unit for playing out different test gradients, a response-determination unit for the measurement of a magnitude response and a phase response to the different test gradients, a reference unit for the performance of a reference measurement without test gradients, and a function determination unit for the determination of a gradient impulse response function on the basis of the magnitude response, the phase response, and the reference measurement. Advantageously, interference effects, which are based, for example, on eddy currents, are also taken into account when determining the gradient impulse response function.

In a variant of the embodiment for the reduction of eddy current-induced magnetic field interferences for a diffusion imaging pulse sequence image correction method, segmented MR acquisitions are corrected. With segmented acquisitions, the k-space is not acquired with a single data acquisition (in other words, after one RF excitation pulse), but with a plurality of data acquisitions (one segment each per RF excitation pulse). Segmenting can take place along the readout direction, such as, for example, in the RESOLVE method, or along the phase-encoding direction.

Equation (3) applies unchanged in readout segmenting to describe the sensitivity to field deviations (in other words, the pixel bandwidth). Compared to non-segmented methods RESOLVE works with shorter echo intervals, and this results in reduced sensitivity.

In phase segmenting, k-space lines are skipped in each acquisition. For example, in the first segment, the even lines are acquired and in the second segment, the odd lines are acquired. Equation (3) thereby changes by the segmenting factor S to Equation 8 as follows:

$$PW = \frac{U \cdot S}{z_P \cdot t_E}. \tag{8}$$

Subsampling and segmenting can be combined with each other.

In an embodiment of the correction for the reduction of eddy current-induced magnetic field interferences for a diffusion imaging pulse sequence, the gradient impulse response function can be determined, for example, with the aid of an MR test acquisition with the aid of a phantom. The magnetic field generated on generation of the test gradient can alternatively or in addition also be determined with the aid of an external field camera, however. The determination of the gradient impulse response function with the aid of a phantom requires less logistical effort and is more cost efficient than the procedure with a field camera.

Alternatively, the field terms of the gradient can also be measured directly using a phantom or with the aid of a field camera without a gradient impulse response function. This procedure is more expensive, however, and takes longer than the procedure mentioned above. In addition, the direct measurement has to be performed again with a change in measurement parameters.

BRIEF DESCRIPTION OF THE DRAWINGS/FIGURES

The disclosure will be explained once again below with reference to the accompanying figures using exemplary embodiments. In the drawings:

FIG. 10 shows an example graph, which illustrates a sequence of test gradients in the time domain and the frequency domain in accordance with one or more embodiments of the present disclosure.

DETAILED DESCRIPTION

Figure 1:
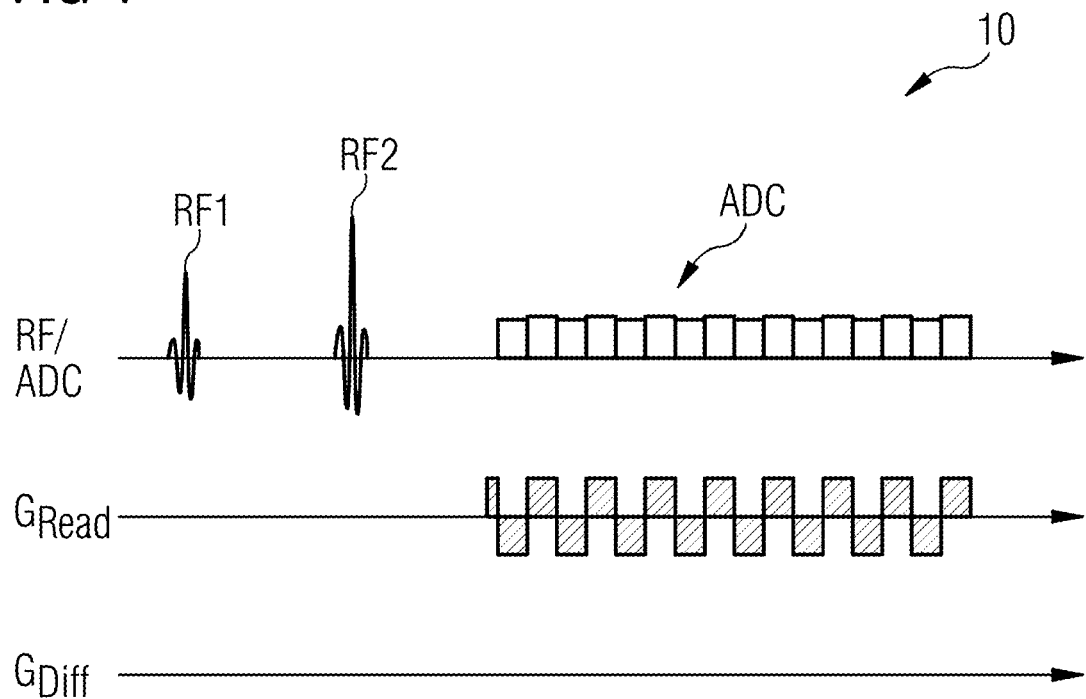
FIG. 1 shows an example pulse graph of echo planar imaging without diffusion weighting, in accordance with one or more embodiments of the present disclosure.

FIG. 1 shows a pulse graph 10 of echo planar imaging without diffusion weighting. In a first line, the pulse graph 10 has an RF excitation pulse RF1 and an RF refocusing pulse RF2. Furthermore, readout windows ADC are drawn in the first line. A second line of the pulse graph illustrates a sequence of readout gradients $G_{Read}$. No gradients are shown in a third line of the pulse graph, which is reserved for the depiction of diffusion gradients $G_{Diff}$, since the pulse sequence shown in FIG. 1 is used for a reference measurement without diffusion weighting. The illustration of slice and phase encoding gradients, which are likewise part of such a pulse sequence, has been omitted solely for the sake of clarity in the depiction shown in FIG. 1.

Figure 2:
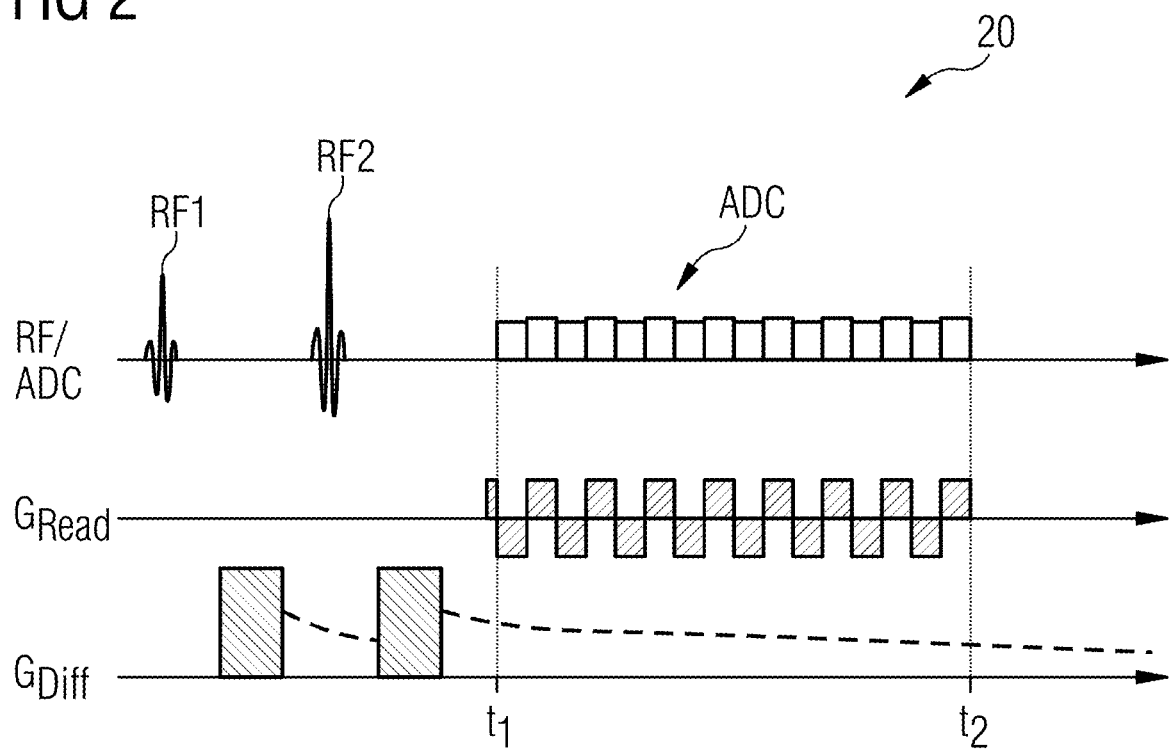
FIG. 2 shows an example pulse graph of echo planar imaging with diffusion weighting, in accordance with one or more embodiments of the present disclosure.

FIG. 2 shows a pulse graph 20 of echo planar imaging with diffusion weighting. For diffusion imaging, the pulse sequence shown in FIG. 2 has two diffusion gradient pulses $G_{Diff}$. The readout process takes place with the aid of the readout gradients $G_{Read}$ in a time interval between the instants $t_1$ and $t_2$. The illustration of slice and phase encoding gradients, which are likewise part of such a pulse sequence, has been omitted solely for the sake of clarity in the depiction shown in FIG. 2 as well.

Figure 3:
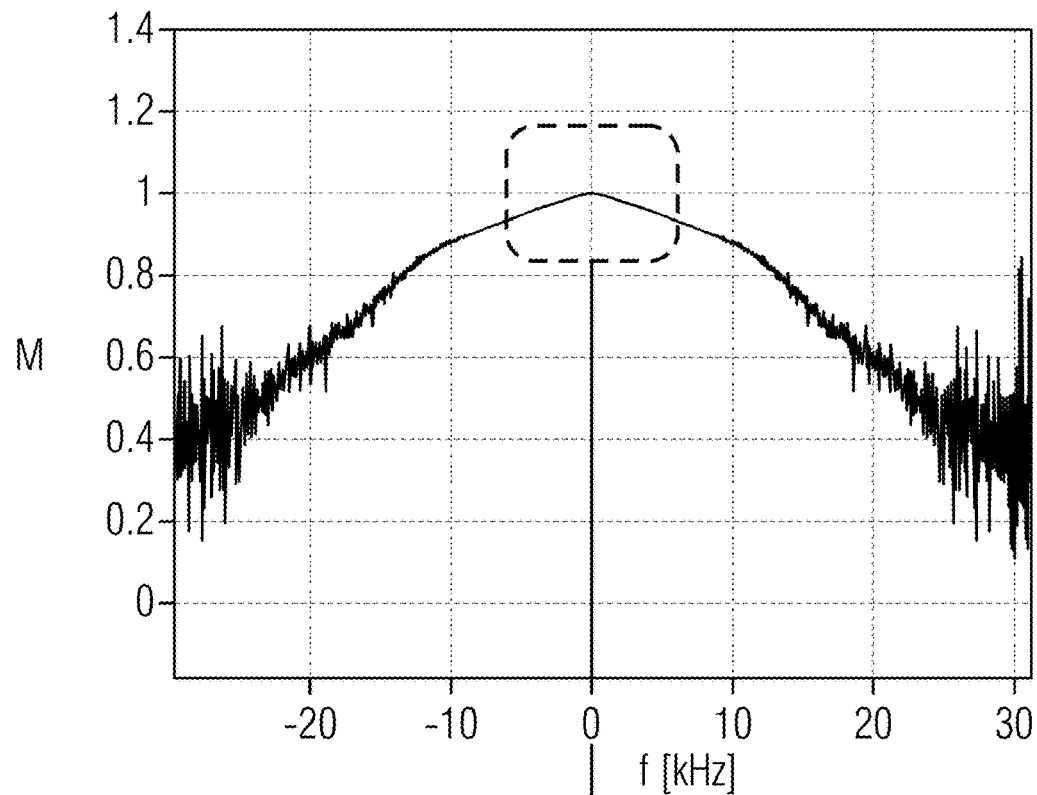
FIG. 3 shows an example graph, which illustrates a magnitude response to a sequence of played-out test gradients, in accordance with one or more embodiments of the present disclosure.
Figure 3:
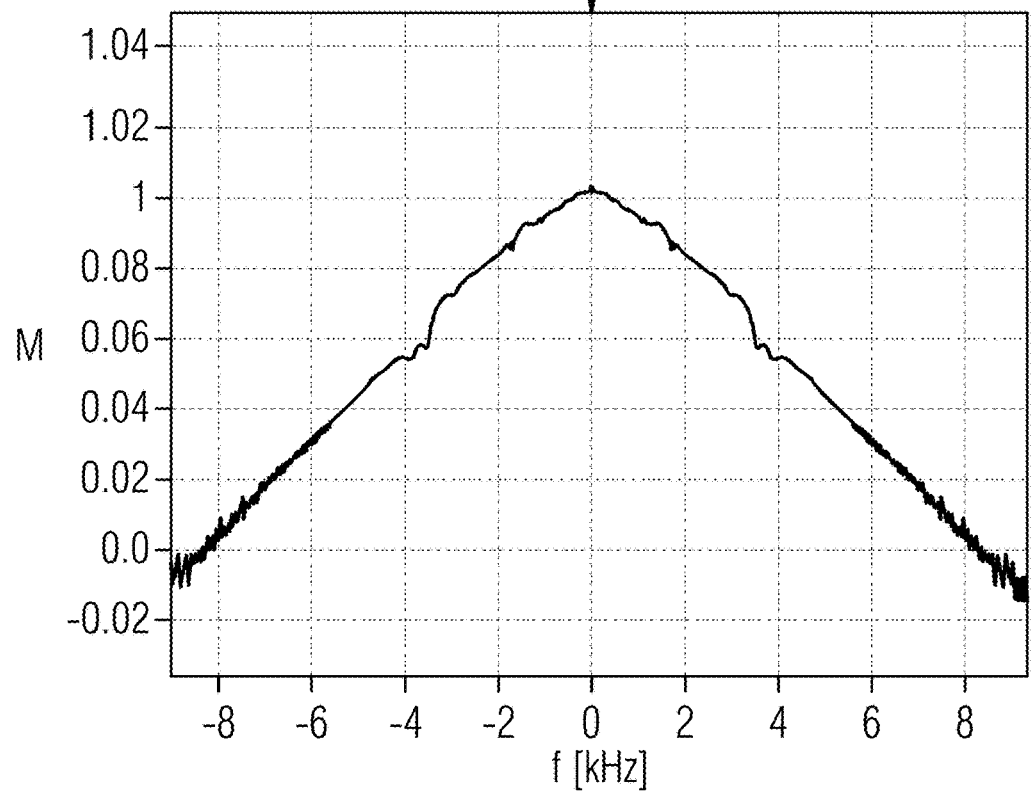

FIG. 3 shows a graph, which illustrates a magnitude response M as a response to a sequence of played-out test gradients as a function of the frequency f. The frequency indicates the frequency components in the gradient signal. In FIG. 3, the bottom part of the graph shows an enlarged detail of the upper part of the graph, which is marked in the top part of the graph in broken lines.

Figure 4:
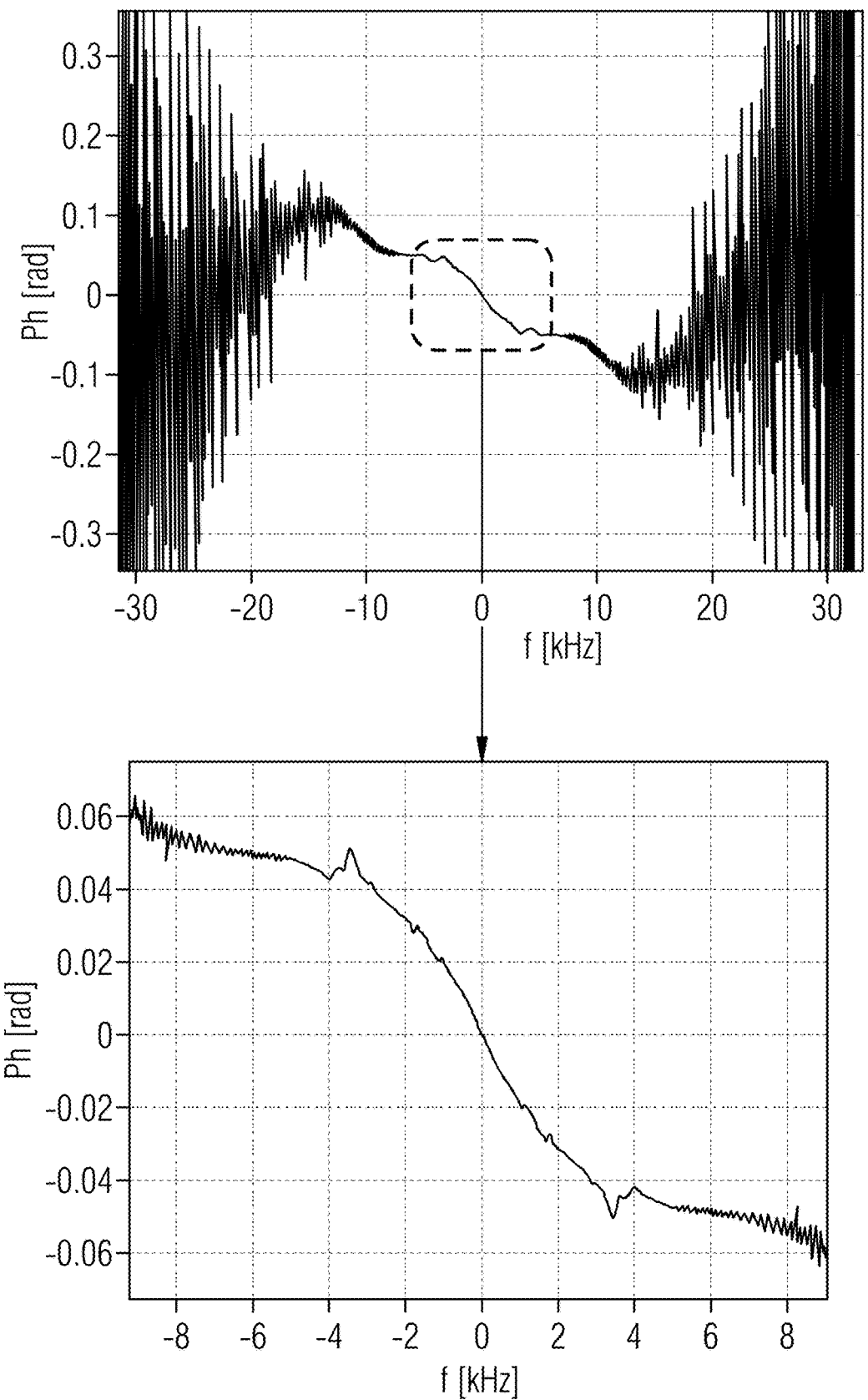
FIG. 4 shows an example graph, which illustrates a phase response to a sequence of played-out test gradients, in accordance with one or more embodiments of the present disclosure.

FIG. 4 shows a graph, which illustrates a phase response Ph as a response to a sequence of played-out test gradients as a function of the frequency f. FIG. 4 shows, likewise in the bottom part of the graph, an enlarged detail of the upper part of the graph, which is marked in the top part of the graph in broken lines.

Figure 5:
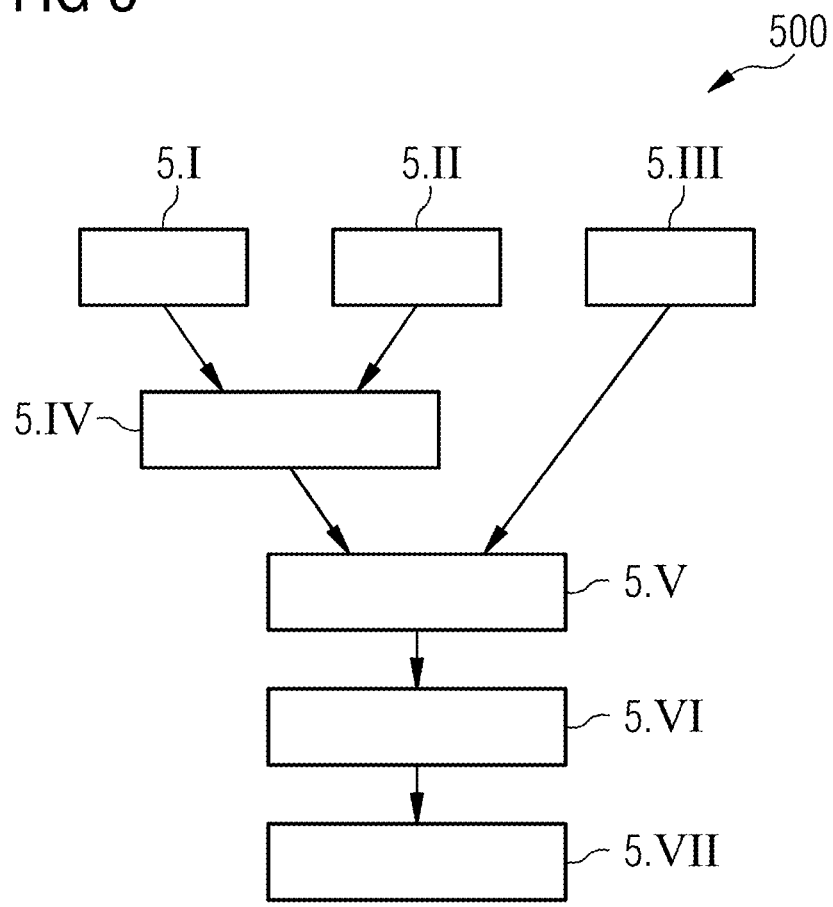
FIG. 5 shows an example process flow, which illustrates an image correction method for the reduction of eddy current-induced magnetic field interferences for a diffusion imaging pulse sequence in accordance with one or more embodiments of the present disclosure.

FIG. 5 shows a process flow 500, which illustrates a method for the reduction of eddy current-induced magnetic field interferences for a diffusion imaging pulse sequence according to an exemplary embodiment of the disclosure.

In step 5.I, firstly a gradient impulse response function GIRF is determined for the diffusion imaging pulse sequence. The gradient impulse response function indicates a correlation between the nominal pulse strength $G_{x/y/z}$ of a played-out gradient and the actual strength $G_{x/y/z}^{corr}$ of this impulse, which deviates as a consequence of magnetic field interferences from the nominal pulse strength G. The substeps 5.Ia to 5.Ie required for the determination of the gradient impulse response function GIRF will be explained in detail in connection with FIG. 6.

Furthermore, an interference gradient pulse sequence $G_{x/y/z}(t)$ is determined on the basis of the diffusion imaging pulse sequence in step 5.II. The interference gradient sequence comprises gradients, which contribute to an eddy current-induced magnetic field interference. These are primarily the gradients of a pulse sequence with the greatest amplitudes, such as, for example, the diffusion imaging gradients. In addition, in step 5.III, a time interval $t_1$, $t_2$ is determined for the acquisition of diffusion image data, in other words, the time interval at which raw data is read out in the course of an acquisition. In step 5.IV, a time-dependent magnetic field deviation $\Delta B_{x/y/z}(t)$ is determined on the basis of the determined gradient impulse response function GIRF and the interference gradient sequence $G_{x/y/z}(t)$. The time-dependent magnetic field deviation $\Delta B_{x/y/z}(t)$ is determined according to Equations (4) to (7). In addition, a magnetic field deviation averaged over the determined time interval $t_1$, $t_2$ is determined in step 5.V. On the basis of the averaged magnetic field deviation $\Delta B_{x/y/z}$, a local displacement, more precisely a displacement field, is determined in step 5.VI. Finally, am image correction is performed in step 5.VII on the basis of the determined local displacement.

Figure 6:
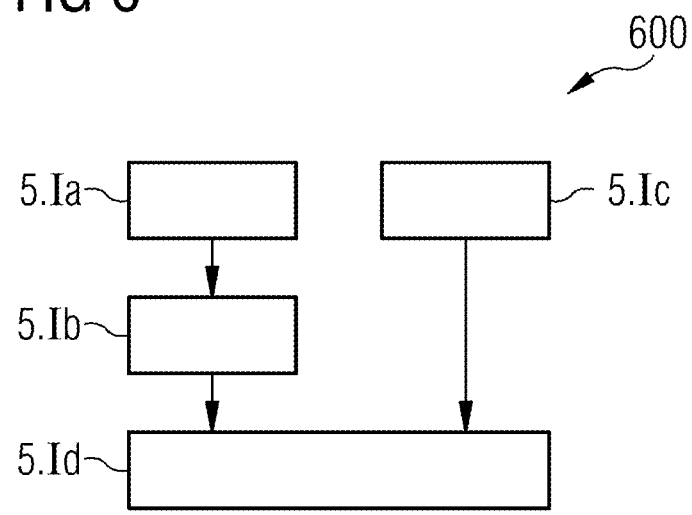
FIG. 6 shows an example process flow, which illustrates a step for the determination of a gradient impulse response function in the context of the example embodiment shown in FIG. 5, in accordance with one or more embodiments of the present disclosure.

FIG. 6 shows a process flow 600, which illustrates the step 5.I for determining a gradient impulse response function in detail. In step 5.Ia, different test gradients are played out. These test gradients are illustrated by way of example in FIG. 10. A magnitude response M and a phase response P to the different test gradients is then measured in step 5.Ib. In addition, a reference measurement without test gradients takes place in step 5.Ic. On the basis of the magnitude response M and the phase response P as well as the reference measurement, a gradient impulse response function GIRF is determined in step 5.Id.

Figure 7:
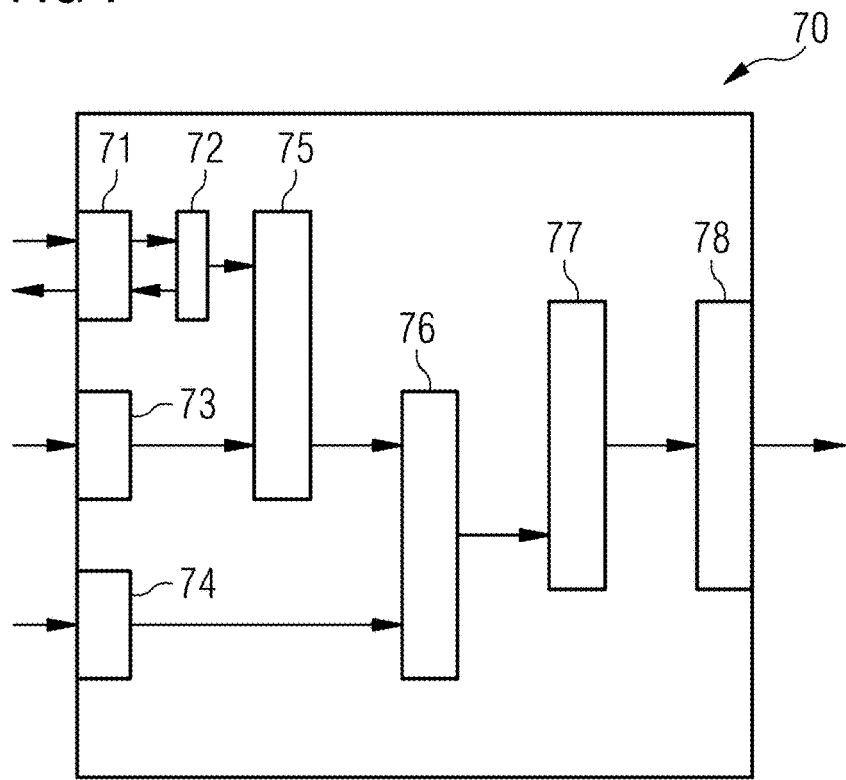
FIG. 7 shows an example block diagram, which illustrates an image correction device in accordance with one or more embodiments of the present disclosure.

FIG. 7 shows a block diagram, which illustrates an image correction device 70 according to an exemplary embodiment of the disclosure. The various components and/or units of the image correction device 70 as discussed herein may be implemented as any suitable combination of hardware and software, e.g. one or more processors, processing circuitry, ports, buffers, drivers, etc. Thus, the various units or other components of the image correction device 70 may alternatively be referred to herein as devices, circuitry, or circuits.

The image correction device 70 comprises an interface 71, which is used, inter alia, for receiving diffusion imaging data or diffusion image data from an examination region. Part of the image correction device 70 is also a determination unit 72 for the determination of a gradient impulse response function GIRF. For this, gradient impulses are played out (e.g. generated, transmitted, or otherwise executed) via the interface 71 and a response signal received via this interface 71. The image correction device also has a gradient defining unit 73 for defining an interference gradient sequence $G_{x/y/z}(t)$ on the basis of the diffusion imaging pulse sequence. For defining the interference gradient sequence $G_{x/y/z}(t)$, the gradient defining unit 73 receives a diffusion imaging pulse sequence and determines the gradients relevant to the generation of eddy currents in the period of the MR acquisition. In addition, the image correction device 70 comprises an interval determination unit 74 for the determination of a time interval $t_1$, $t_2$ for the acquisition of diffusion image data. For this, the interval determination unit 74 receives information about the diffusion imaging pulse sequence used and on the basis of this determines the image acquisition period or the period in which the gradients of the diffusion imaging pulse sequence have an effect on the development of the eddy currents. The gradient impulse response function GIRF and the knowledge of the diffusion imaging pulse sequence are used by an interference field determination unit 75 to determine a time-dependent magnetic field deviation $\Delta B_{x/y/z}(t)$ on the basis of the determined gradient impulse response function GIRF and the interference gradient sequence $G_{x/y/z}(t)$. An averaging unit 76 is used to determine a magnetic field deviation averaged over the determined time interval $t_1$, $t_2$. The averaged magnetic field deviation $\Delta B_{x/y/z}$ is used by a distortion determination unit 77 to calculate an image distortion. The image correction takes place by way of a correction unit 78 on the basis of the determined image distortion.

Figure 8:
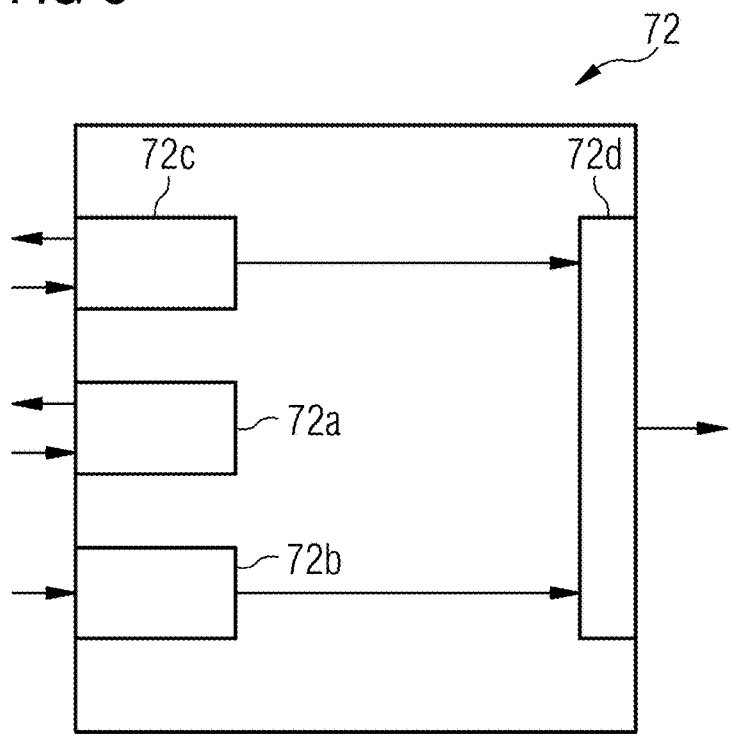
FIG. 8 shows an example block diagram, which illustrates a determination unit for the determination of a gradient impulse response function in accordance with one or more embodiments of the present disclosure.

In FIG. 8, the determination unit 72 shown in FIG. 7 is illustrated in further detail. The determination unit 72 has a test unit 72a, which plays out a sequence of test gradients. The test gradients comprise, for example, a number of triangle gradients. Part of the determination unit 72 is also a response-determination unit 72b, which is adapted to measure a response signal to the test gradients. The response signal comprises a magnitude response M and a phase response P. The determination unit 72 also comprises a reference unit 72c, which plays out a pulse sequence, which corresponds to the test-pulse sequence with the exception that it does not have any diffusion gradients. The reference measurement data from the reference measurement without test gradients is then also acquired by the response determination unit 72b. A function determination unit 72d determines a gradient impulse response function GIRF on the basis of the magnitude response M and the phase response P as well as the results of the reference measurement and knowledge of the pulse sequences used. The gradient impulse response function GIRF indicates the connection between the played-out gradient and the gradient field strengths actually measured.

Figure 9:
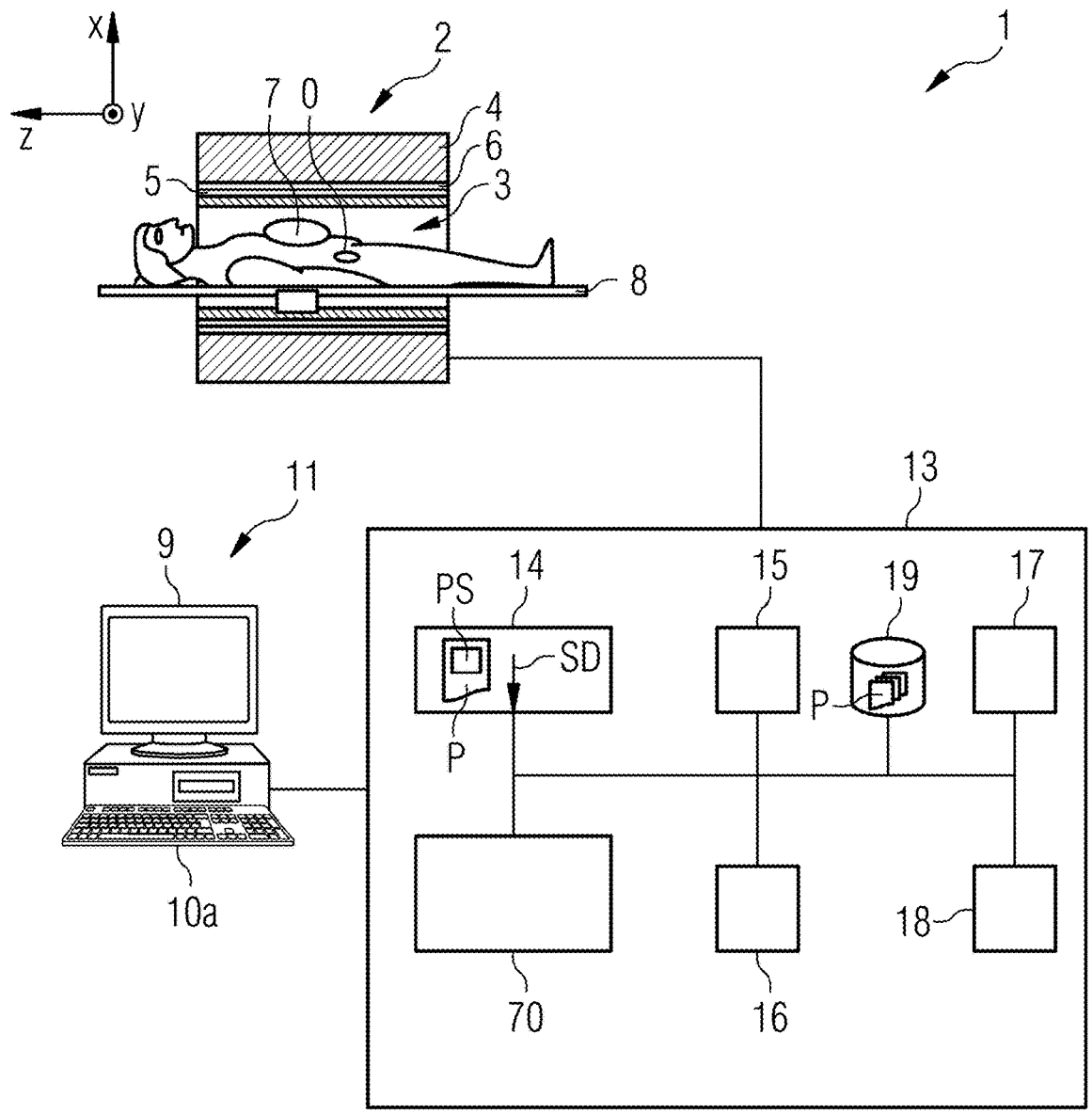
FIG. 9 shows an example schematic diagram of an MR imaging system in accordance with one or more embodiments of the present disclosure.

FIG. 9 illustrates a magnetic resonance tomography system 1 in a roughly schematic manner. Firstly, it comprises the magnetic resonance scanner 2 with an examination space 3 or patient tunnel in which, on a couch 8, a patient or test person is positioned in whose body the actual examination object O is located. Although the examination object O in the torso is mapped in the illustrated example, diffusion tensor imaging may also be used for acquisitions of the brain since it is particularly suitable for mapping neurological structures.

The magnetic resonance scanner 2 is conventionally fitted with a basic field magnet system 4, a gradient system 6, an RF transmit antenna system 5, and an RF receive antenna system 7. In the illustrated exemplary embodiment, the RF transmit antenna system 5 is a body coil permanently installed in the magnetic resonance scanner 2, whereas the RF receive antenna system 7 includes local coils that are to be arranged on the patient or test person (symbolized in FIG. 9 by just a single local coil in this example). Basically, the body coil can also be used as the RF receive antenna system and the local coils as the RF transmit antenna system if these coils can each be switched into different operating modes. The basic field magnet system 4 is conventionally designed here such that it generates a basic magnetic field in the longitudinal direction of the patient, in other words, along the longitudinal axis of the magnetic resonance scanner 2 running in the z-direction. The gradient system 6 conventionally comprises individually actuatable or switchable gradient coils to be able to switch gradients in the x-, y- or z-direction independently of each other. In addition, the magnetic resonance scanner 2 includes shim coils (not shown), which can be conventionally designed.

The magnetic resonance imaging system illustrated in FIG. 9 is a body coil system with a patient tunnel, into which a patient can be introduced. The embodiments of the present disclosure can also be used on other magnetic resonance imaging systems, for example with a laterally open, C-shaped housing, etc. It is only essential that appropriate acquisitions of the examination object O can be produced.

The magnetic resonance imaging system 1 also has a central control device 13, which is used for control of the MR system 1. In various embodiments, the control device 13 may be implemented as one or more processors, processing circuitry, etc., configured to execute program segments and/or instructions stored, for instance, in the memory 19 or other suitable storage location, which may be implemented as a non-transitory computer-readable medium, for example. The control device 13 may execute the program segments and/or instructions to cause the control device 13 and/or the magnetic resonance imaging system 1 to perform any of the embodiments as discussed herein, such as the reduction of eddy current-induced magnetic field interferences for a diffusion imaging pulse sequence, for instance. This central control device 13 comprises a sequence control unit 14. With this unit, the sequence of radio frequency pulses (RF pulses) and of gradient pulses is controlled as a function of a chosen pulse sequence PS or a sequence of a plurality of pulse sequences for the acquisition of a plurality of slices in a volume region of the examination object of interest within one measuring session. Such a pulse sequence PS can be specified and parameterized, for example, within a measuring or control protocol P. Conventionally, different control protocols P for different measurements or measuring sessions are stored in a memory 19 and can be selected by an operator (and if required, optionally changed) and then used for carrying out the measurement. In the present case, the control device 13 contains pulse sequences for the acquisition of the raw data.

To emit the individual RF pulses of a pulse sequence PS, the central control device 13 has a radio frequency transmit device 15, which generates the RF pulses, amplifies them and feeds them via a suitable interface (not shown in detail) into the RF transmit antenna system 5. To control the gradient coils of the gradient system 6 to appropriately switch the gradient pulses in accordance with the specified pulse sequence PS, the control device 13 has a gradient system interface 16. The diffusion gradient pulses and, for example, also spoiler gradient pulses can be applied via this gradient system interface 16. The sequence control unit 14 communicates appropriately, for example by emitting sequence control data SD, with the radio frequency transmit device 15 and the gradient system interface 16 for the execution of the pulse sequence PS.

The control device 13 also has a radio frequency receiving device 17 (likewise communicating appropriately with the sequence control unit 14) to receive, within the readout windows ADC specified by the pulse sequence PS and in a manner coordinated by means of the RF receive antenna system 7, magnetic resonance signals and thus acquire the raw data.

A reconstruction unit 18 adopts the acquired raw data here and reconstructs magnetic resonance image data therefrom. As a rule, this reconstruction also takes place on the basis of parameters, which can be specified in the respective measuring or control protocol P. This image data can then be stored, for example, in a memory 19.

A person skilled in the art basically knows how in detail, by way of irradiation of RF pulses and switching of gradient pulses, suitable raw data can be acquired and MR images or parameter maps reconstructed therefrom, and this will not be explained in detail here, therefore.

The image correction device 70 is in data communication with the other units, e.g. the gradient system interface 16 and/or the sequence control unit 14. Alternatively, the image correction device 70 can also be part of the gradient system interface 16 and/or the sequence control unit 14. The image correction device 70 comprises a plurality of units for the determination or ascertainment of different variables. On the one hand, suitable test and reference pulse sequences are generated by the image correction device 70 and transferred to the gradient system interface 16 and the sequence control unit 14. On the other hand, image data, which was generated by the reconstruction unit 18, is corrected by the image correction device 70 on the basis of a determined gradient impulse response function GIRF in the manner illustrated in connection with FIG. 5 to FIG. 8. Corrected image data is transferred to the memory 19 and can be stored there.

The central control device 13 can be operated by way of a terminal 11 with an input unit 10a and a display unit 9 by way of which the entire magnetic resonance imaging system 1 can therefore also be operated by one operator. Magnetic resonance images can also be displayed on the display unit 9, and by means of the input unit 10a, optionally in combination with the display unit 9, measurements can be planned and started and, for instance, control protocols P can be chosen and optionally modified.

The magnetic resonance imaging system 1 and, in particular, the control device 13 can also have a large number of further components, not shown here in detail but conventionally present on systems of this kind, such as, for example, a network interface, to connect the entire system with a network and to exchange raw data, and/or image data, and/or parameter maps, but also further data, such as, for example, patient-relevant data or control protocols.

The person skilled in the art basically knows how appropriate raw data can be acquired by way of irradiation of RF pulses and the generation of gradient fields, and magnetic resonance imaging images reconstructed therefrom, and this will not be explained in detail here. Similarly, a wide variety of measuring sequences, such as, for example, EPI measuring sequences or other measuring sequences for the generation of diffusion-weighted images are known in principle to a person skilled in the art.

FIG. 10 shows three graphs, which illustrate triangular pulses, which are used as test gradients. The illustration on the left shows the 12 test gradients in the time domain. The test gradients have a duration between 100 ρs and 320 ρs and a gradient field strength A of about 9 to 30 mT/m. The middle graph illustrates the 12 test gradients in the frequency domain, with the magnitude M thereof being plotted over the frequency f. The illustration on the right is the envelope of test gradients illustrated in the middle graph in the frequency domain. It can be seen that the zero points are balanced and there is adequate spectral coverage in a broad frequency domain. A Dirac pulse is "imitated" as it were thereby.

In conclusion, reference is made once again to the fact that the methods and structures described in detail above are merely exemplary embodiments and that the basic principle can also be varied by a person skilled in the art in wide ranges without departing from the scope of the disclosure insofar as it is specified by the claims. Furthermore, the described method is not limited to medical applications either. For the sake of completeness, reference is also made to the fact that use of the indefinite article "a" or "an" does not preclude the relevant features from also being present several times. Similarly, the term "unit" does not preclude this from also being composed of a plurality of components, which can optionally also be spatially distributed.

What is claimed is:

1. A method for reducing eddy current-induced magnetic field interferences for a diffusion imaging pulse sequence, comprising:
   determining, via one or more processors, a generic gradient impulse response function (GIRF);
   defining, via one or more processors, an interference gradient sequence using the diffusion imaging pulse sequence;
   determining, via one or more processors, a time interval for the acquisition of diffusion image data;
   determining, via one or more processors, a time-dependent magnetic field deviation using the determined GIRF and the interference gradient sequence within the determined time interval; and
   compensating for an image distortion of an acquisition of diffusion imaging by applying the diffusion imaging pulse sequence using the determined time-dependent magnetic field deviation, the compensating for the image distortion comprising performing an image correction that occurs subsequent to the acquisition of the diffusion imaging.

2. An image correction device, comprising:
   an interface configured to receive diffusion-encoded image data from an examination region and to generate a test pulse sequence;
   determination circuitry configured to determine a gradient impulse response function (GIRF);
   gradient defining circuitry configured to define an interference gradient sequence using the diffusion imaging pulse sequence;
   interval determination circuitry configured to determine a time interval for the acquisition of diffusion image data;
   interference field determination circuitry configured to determine a time-dependent magnetic field deviation using the determined GIRF and the interference gradient sequence within the determined time interval; and
   compensation circuitry configured to compensate for an image distortion of an acquisition of diffusion imaging by applying the diffusion imaging pulse sequence using the determined time-dependent magnetic field deviation, the compensating for the image distortion comprising performing an image correction that occurs subsequent to the acquisition of the diffusion imaging.

3. A non-transitory computer-readable memory having instructions stored thereon that, when executed by a control device of a magnetic resonance imaging system, cause the magnetic resonance imaging system to reduce eddy current-induced magnetic field interferences for a diffusion imaging pulse sequence by:
   determining a generic gradient impulse response function (GIRF);
   defining an interference gradient sequence using the diffusion imaging pulse sequence;
   determining a time interval for the acquisition of diffusion image data;
   determining a time-dependent magnetic field deviation using the determined GIRF and the interference gradient sequence within the determined time interval; and
   compensating for an image distortion of an acquisition of diffusion imaging by applying the diffusion imaging pulse sequence using the determined magnetic field deviation, the compensating for the image distortion comprising performing an image correction that occurs subsequent to the acquisition of the diffusion imaging.

4. The method as claimed in claim 1, wherein the act of compensating for the image distortion comprises:
   determining, via one or more processors, a magnetic field deviation averaged over the determined time interval;
   determining, via one or more processors, a local displacement using the averaged magnetic field deviation; and
   performing, via one or more processors, the image correction using the determined local displacement.

5. The method as claimed in claim 1, wherein the act of compensating for the image distortion comprises:
   determining, via one or more processors, a compensation gradient using the determined magnetic field deviation; and
   switching, via one or more processors, compensation gradients during diffusion imaging by applying the diffusion imaging pulse sequence.

6. The method as claimed in claim 1, wherein the act of determining the GIRF comprises:
   executing different test gradients;
   measuring a magnitude response and a phase response to the different test gradients;

performing a reference measurement without test gradients; and determining the GIRF using the magnitude response, the phase response, and the reference measurement.

7. The method as claimed in claim 6, wherein the test gradients have a triangular shape and cover a plurality of frequencies.

8. The method as claimed in claim 1, wherein the interference gradient sequence comprises diffusion gradients.

9. The method as claimed in claim 8, wherein the interference gradient sequence comprises additional gradients for diffusion imaging.

10. The method as claimed in claim 9, wherein the additional gradients comprise spoiler gradients.

11. The method as claimed in claim 1, wherein the interference gradient sequence comprises a plurality of diffusion gradient sequences associated with measurements performed in temporal succession.

12. The method as claimed in claim 1, further comprising:
determining, via one or more processors, a time-dependent magnetic field deviation of the first order using the interference gradient sequence and a corrected diffusion gradient sequence that is calculated by a convolution of linear self-terms of the determined GIRF with the interference gradient sequence.

13. The method as claimed in claim 1, further comprising:
determining, via one or more processors, a time-dependent magnetic field deviation of the zeroth order using a derivation over time of a convolution of the interference gradient sequence with terms of the zeroth order of the GIRF.

14. The method as claimed in claim 1, further comprising:
determining, via one or more processors, a local displacement as a scalar displacement transformation field,
wherein, for each pixel in an acquired image associated with image information, a displacement in the image information occurs along a phase-encoding direction.

15. The method as claimed in claim 1, wherein the acquisition of diffusion imaging comprises an acquisition of diffusion-weighted magnetic resonance image data of an examination object by acquiring diffusion-encoded raw data using a diffusion-encoding gradient impulse sequence, and reconstructing diffusion-encoded image data using the diffusion-encoded raw data, and
wherein the act of compensating for the image distortion comprises performing a correction of the reconstructed diffusion-encoded image data using the determined magnetic field deviation.

16. The image correction device as claimed in claim 2, wherein the determination circuitry comprises:
test circuitry configured to generate different test gradients;
response determination circuitry configured to measure a magnitude response and a phase response to the different test gradients;
reference circuitry configured to perform a reference measurement without test gradients; and
function determination circuitry configured to determine the GIRF using the magnitude response, the phase response, and the reference measurement.

17. The image correction device as claimed in claim 2, wherein the image correction device is part of a magnetic resonance imaging system.

* * * * *